United States Patent [19]
Blomley

[11] Patent Number: 4,506,113
[45] Date of Patent: Mar. 19, 1985

[54] WAVEFORM CLIPPING CIRCUITS

[75] Inventor: Peter F. Blomley, Bishop's Stortford, England

[73] Assignee: International Standard Electric Corporation, New York, N.Y.

[21] Appl. No.: 491,834

[22] PCT Filed: Mar. 4, 1982

[86] PCT No.: PCT/GB82/00069
§ 371 Date: May 5, 1983
§ 102(e) Date: May 5, 1983

[87] PCT Pub. No.: WO83/03176
PCT Pub. Date: Sep. 15, 1983

[51] Int. Cl.³ .............................................. H04M 1/60
[52] U.S. Cl. .................................. 179/81 B; 307/540; 179/16 F; 328/169
[58] Field of Search ................. 179/81 B, 81 R, 16 F; 307/540, 546; 328/169; 333/28 R

[56] References Cited
U.S. PATENT DOCUMENTS
4,236,116 11/1980 Beseke et al. ................... 328/169
FOREIGN PATENT DOCUMENTS
923573 3/1973 Canada.

Primary Examiner—Gene Z. Rubinson
Assistant Examiner—James L. Dwyer
Attorney, Agent, or Firm—John T. O'Halloran; Thomas F. Meagher

[57] ABSTRACT

A soft clipping circuit for a telephone subset limits the output signal amplitude to the line thus preventing output stage saturation with consequent reduction in impedance. The circuit includes a variable gain input stage (I/P), a main speech signal amplifier (AMP1) and a rectifying amplifier feed back stage (AMP2) that generates a control current whenever the output speech signal exceeds a predetermined threshold. This current is fed to the input stage so as to reduce its gain. Typically the input stage comprises a long tailed transistor pair amplifier, the control current being fed to the tail of the pair.

5 Claims, 8 Drawing Figures

WAVEFORM CLIPPING CIRCUITS

BACKGROUND OF THE INVENTION

This invention relates to speech signal processing and in particular to soft clipping circuits especially for an electronic circuit network in a telephone subscriber's instrument.

Conventional electromechanical telephone networks are inherently slow and, even under overload conditions, generate only minor harmonic outputs. In contrast the new electronic networks are fast and, when overload and consequent speech waveform clipping occurs, they produce an excessive proportion of harmonics that are outside the voice band (typically 300 Hz to 3.4 kHz). These harmonics are transmitted with little attenuation through the hybrid balance network, which is tuned to reject signals in the voice band, to the instrument receiver thus resulting in poor side-tone performance. Furthermore, in order for the hybrid to remain balanced and the return loss to remain greater than −14 db, as required by most telephone administrations, the impedance of the instrument as 'seen' by the line should be 600 ohms (900 ohms in USA) irrespective of the signal amplitude. When electronic subsets at present in use are overloaded causing clipping the output transistor stage can be driven into saturation. When this occurs the impedance 'seen' by the line falls to that of a saturated transistor, i.e. only a few ohms. Attempts have been made to prevent output transistor saturation by the use of clipping diodes. However, the impedance of the diodes then shunts the 600 ohm output impedance causing the aforementioned problems of impedance changes, hybrid imbalance and the generation of out of band harmonics.

The problem of harmonic generation may be overcome by the use of circuits which soft clip the speech waveform in contrast e.g. to diode circuits which produce hard clipping. A soft clipping circuit does not have a sharp cut-off level but progressively reduces the overall voice channel gain beyond a predetermined threshold amplitude. This provides a smooth transition from high to low gain thus preventing 'splatter'. When soft clipping is applied to a signal substantially all the power is concentrated in the fundamental and the lower order harmonics, the latter being in or close to the voice frequency band. Thus, rejection to the receiver path by the hybrid network is still obtained.

Soft clipping alone, however, does not overcome the major problems of changes in the output impedance to the line and in particular the reduction of impedance caused by output stage saturation. The latter effect can be overcome by suitable choice of the circuit operating parameters which ensure that the waveform is always below the amplitude at which saturation occurs. The problem of impedance changes related to gain transformations has, however, proved intractable with conventional telephone circuits which employ negative feedback for gain regulation and, thus, suffer from an impedance reduction as the gain is reduced.

SUMMARY OF THE INVENTION

According to one aspect of the present invention there is provided a speech processing circuit e.g. for an electronic telephone subset, the speech processing circuit including a variable gain element whereby soft clipping of a speech waveform may be effected, and negative feedback means, coupled between the circuit output and the variable gain element, whereby the gain of the variable gain element is controlled such that the circuit output impedance is maintained substantially independent of an input speech signal amplitude.

According to another aspect of the invention there is provided a speech processing circuit e.g. for an electronic telephone subset, the speech processing circuit including a continuously variable gain input stage, a signal amplifier coupled to the input stage, an output stage coupled to the amplifier, and rectifying feedback means coupled between the output stage and the input stage, the circuit being such that, at predetermined positive and negative output signal threshold levels within the saturation levels of the output stage, the feedback means generates a feedback signal whereby the gain of the input stage is progressively reduced.

According to a further aspect of the invention there is provided a speech processing circuit e.g. for an electronic telephone subset, the speech processing circuit including first and second long tailed transistor pairs whereby speech signals are soft clipped, an output amplifier stage coupled to the long tailed pairs, and negative feedback means coupled between the output stage and the long tailed pairs, wherein the transistors of the long tailed pairs are so constructed that gain maxima of the long tailed pairs are symmetrically disposed about the speech signal zero level and spaced from that level by a voltage corresponding to the onset of soft clipping, and wherein the feedback means is arranged to feed the tail circuits of the long tailed pairs with respective first and second currents whereby the combined output impedance of the long tailed pairs is maintained substantially constant.

The arrangement operates by progressively attenuating the waveform as a predetermined threshold level is approached. This not only substantially prevents the generation of out of band harmonics, but also provides a much higher sound quality than that produced by conventional hard clipping. It has in fact been found that the human ear responds primarily to the rate of the zero crossings of a waveform. Thus, soft clipping of an audio signal gives very little subjective impression of reduction of loudness. Furthermore, soft clipping of a signal reduces the amplifier power necessary to provide audibility e.g. in hearing aid applications.

The arrangement described herein overcomes the disadvantages of previous telephone circuits in that means are provided whereby the circuit output impedance, i.e. the impedance 'seen' by the line, is maintained substantially constant for all input signal levels.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

Figure 1:
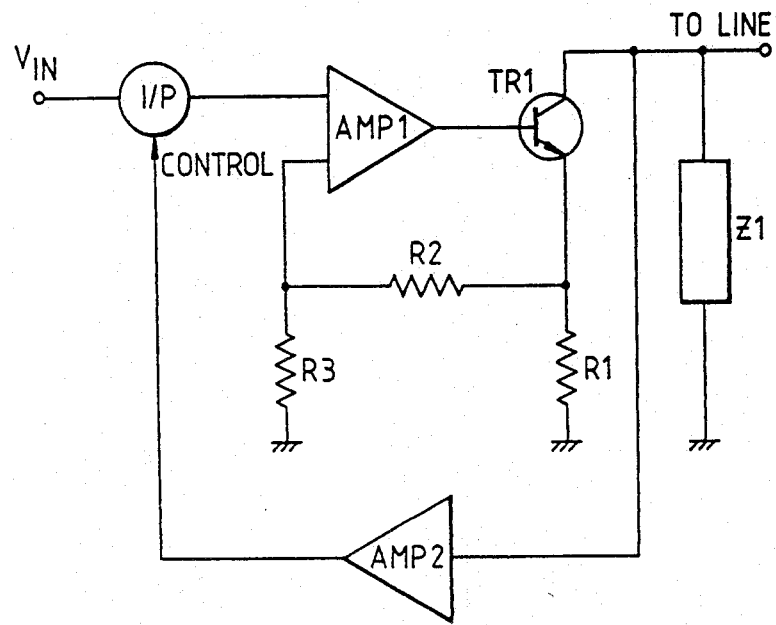
FIG. 1 is a schematic circuit diagram of a soft clipping circuit embodying the techniques described herein.

Referring to FIG. 1, the schematic circuit shown illustrates the soft clipping technique employed herein. The circuit, which is intended primarily for use in a telephone subset, includes a speech signal input stage I/P having a controllable gain, typically less than unity. The output of this input stage is fed to one input amplifier AMP 1 the output of which drives the base of an output transistor TR1. The other terminal of the amplifier AMP 1 is coupled to the emitter circuit of the transistor TR1 e.g. via resistor network R1, R2 and R3. Output to the line is taken from the collector of transistor TR1 and, to ensure correct matching to the line impedance, an impedance Z1 (typically 600Ω) shunts the collector to the circuit ground.

Figure 2:
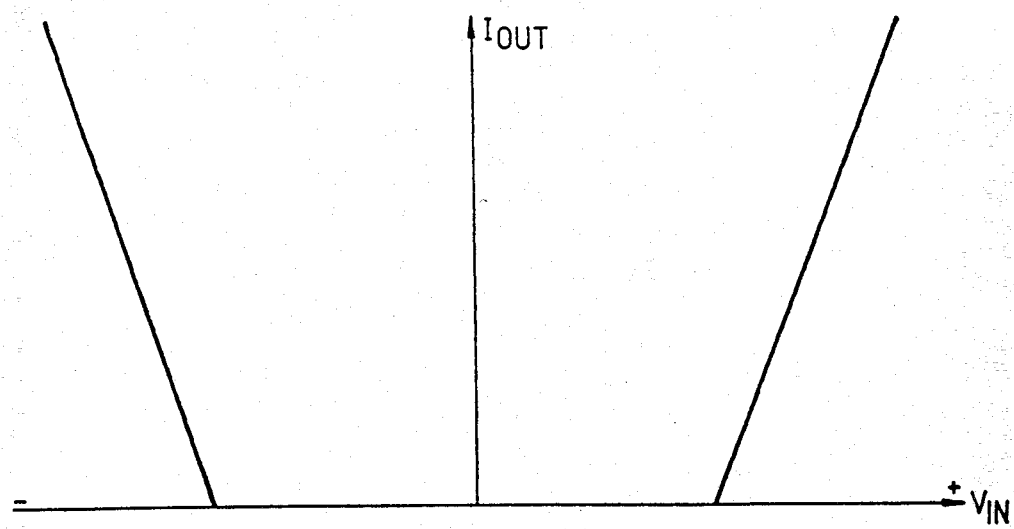
FIG. 2 illustrates the characteristic of a feedback amplifier employed in the circuit of FIG. 1.

In order to provide impedance matching to the line under all input signal level conditions it is essential that the input drive to the base of transistor TR1 is maintained below the level at which that transistor is driven into saturation with consequent shunting of impedance Z1. This is achieved via a rectifying amplifier AMP 2 coupled to the circuit output, i.e. transistor TR1 collector. The characteristic of this amplifier is shown in FIG. 2. For input voltages below a positive or above a negative threshold value the amplifier output is zero. If, however, these thresholds are exceeded a rapidly increasing positive output signal is produced. This signal is fed to a control input of the controllable gain stage thereby reducing the gain of that stage. The rectifying amplifier input threshold is set at a level below that at which saturation of transistor TR1 occurs thus ensuring that the drive to transistor TR1 base is suitably limited.

It is of course necessary that the gain of the input stage I/P should transform smoothly from a higher gain to a lower gain state and vice versa so as to prevent hard clipping of an input signal.

It will of course be understood that the term gain as employed herein is understood to include an amplification of less than unity and, in some instances, a zero amplification.

Figure 3:
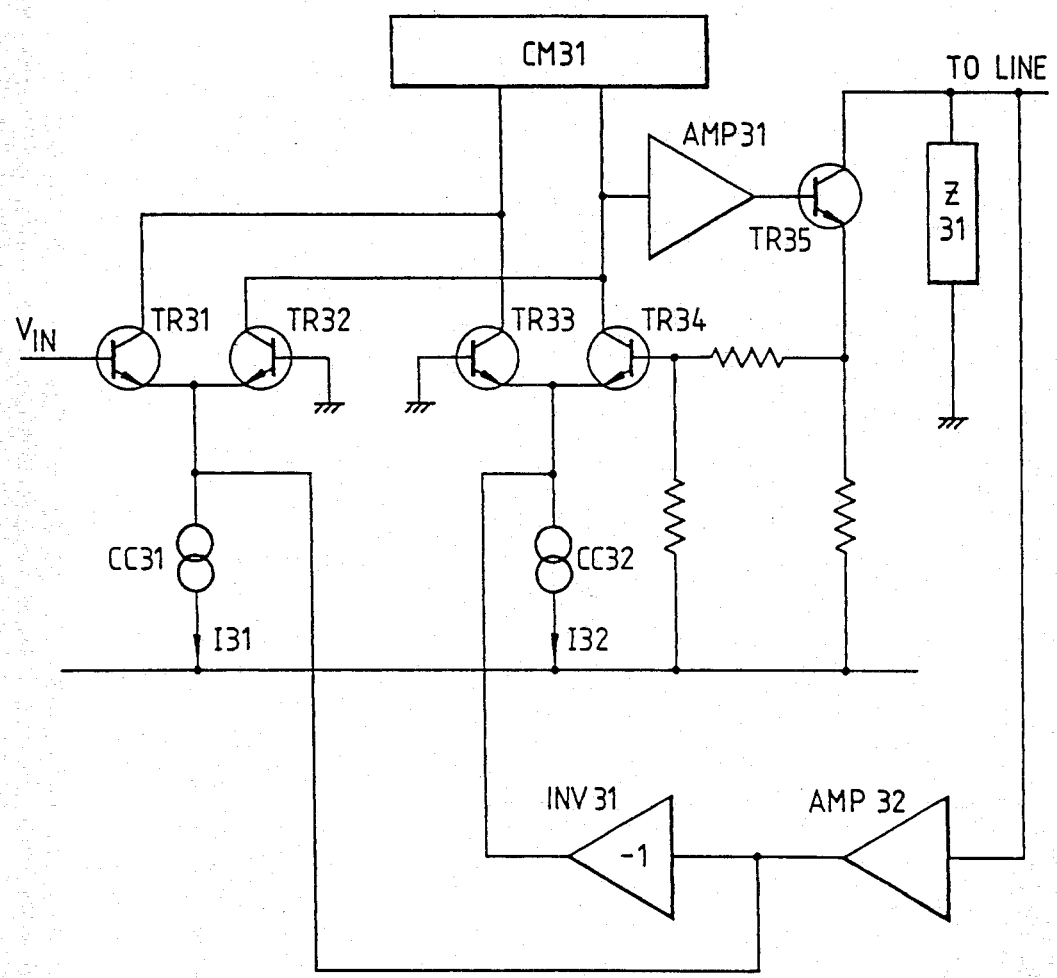
FIG. 3 shows one form of soft clipping circuit arrangement.

A circuit that achieves soft clipping and prevents output stage saturation is shown in FIG. 3. In this circuit the controllable gain input stage comprises first and second transistor long tailed pairs, transistors TR31,TR32 and transistors TR33,TR34 fed from a current mirror, CM31. Constant current sources CC31 and CC32 generating currents I31 and I32, respectively, are coupled one in each common emitter circuit.

Input speech signals are fed to the base of transistor TR31 of the first pair whilst the base of the input transistor TR33 of the second pair is grounded, i.e. the second pair receives a zero signal. The outputs of the two pairs, i.e. the collectors of transistors TR32 and TR34, are commoned and are fed via an amplifier AMP 31 to the base of an output transistor TR5 the collector of which is, in use, coupled to the line. Impedance matching to the line is provided by shunt impedance Z31. It should be noted that impedance Z31 may in some applications include a reactive element.

The circuit of FIG. 3 is arranged such that, for input signals below the threshold level at which soft clipping is intended to commence, the major proportion of the signal generated at the output common collectors of the two long tailed pairs derives from the first pair, i.e. the zero signal second pair has only a small effect on the signal output and the stage is thus in its higher gain condition.

When the output signal to the line exceeds the threshold of the rectifying amplifier AMP 32 that amplifier generates an output current whose magnitude increases in correspondence with the signal level above the threshold. This current is fed into the tail circuit of the first long tailed pair thus reducing the current through that pair. At the same time a substantially equal and opposite current generated by inverter INV 1 flows from the tail circuit of the second long tailed pair. This increases the current through the transistors of the second pair. The net effect is to reduce the proportion of the stage output due to the first long tailed pair and to increase the output due to the second pair thus producing an effective reduction in stage gain. The sloping characteristic of the amplifier AMP 32 ensures that this reduction in gain is effected smoothly, thus, providing effective soft clipping of a speech waveform.

Figure 4:
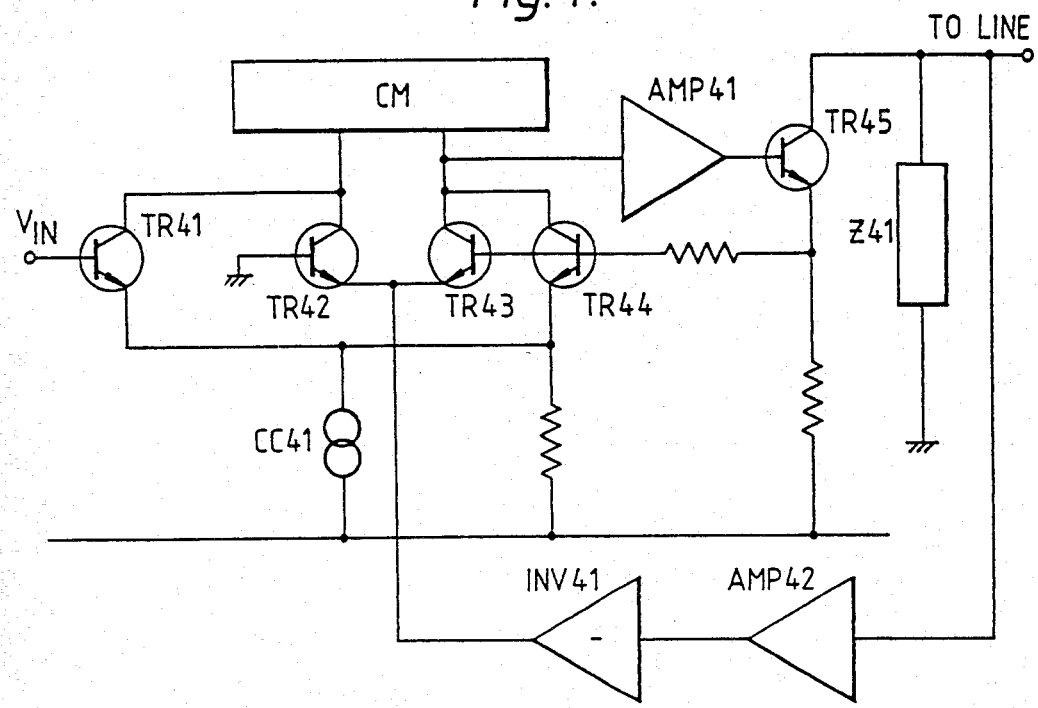
FIG. 4 shows a modification of the circuit of FIG. 3.

FIG. 4 shows a modification of the soft clipping circuit of FIG. 3. In this arrangement the variable gain stage, as before, comprises first and second long tailed transistor pairs TR41,TR44; TR42,TR43, the first of which receives the input speech signal. The tail circuit of this first pair includes a constant current generator CC41 whereby the signal transfer characteristic of that pair is defined. The input of the second pair, transistors TR42,TR43 is grounded so as to produce a zero output. The stage output to amplifier AMP 41 is thus, as before, a weighted combination of the output of each pair, the weighting being determined by the selective tail currents. Gain control and, hence, soft clipping is provided by a feedback current from a rectifying amplifier AMP 42, as described with reference to FIGS. 2 and 3, which provides tail current for the second pair via inverter INV 41 whenever the output signal at the collector of transistors TR45 exceeds a predetermined threshold. This increases the weighting of the second pair component, i.e. the zero signal, in the combined output to amplifier AMP 41, thus, providing a smooth soft clipping action. Again the threshold of amplifier AMP 42 is such that the output transistor TR45 is never driven into saturation.

It will be apparent to those skilled in the art that the gain characteristic of a transistor long tailed pair varies with signal amplitude and that, in some applications, it may be desirable to provide linearization of the gain characteristic. A circuit which embodies this linearization is shown in FIG. 5.

Figure 5:
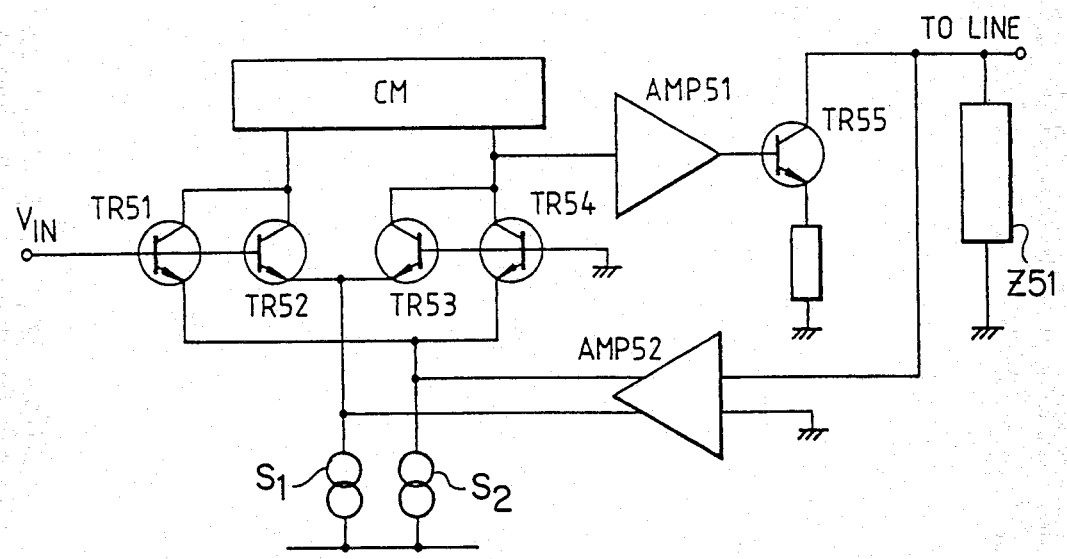
FIG. 5 is a circuit diagram of an alternative soft clipping circuit.

Referring now to FIG. 5, the circuit shown therein includes a variable gain input stage via which speech signals are fed to an output amplifier, and a feedback amplifier whereby the gain of the input stage is controlled. The variable gain stage comprises first and second transistor long tailed pairs TR51,TR54 and TR52,TR53 fed from a current mirror CM and each of which is provided with a constant current source $S_1$, $S_2$, coupled in the tail of the pair.

Figure 6A:
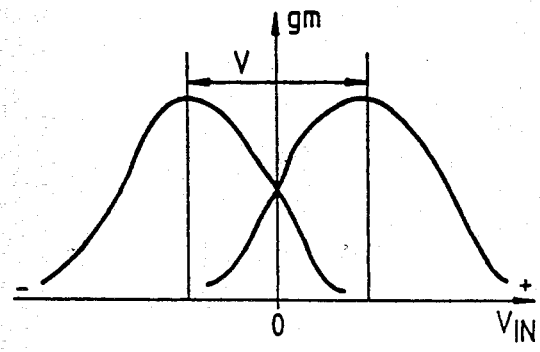
FIGS. 6a and 6b illustrate the gain characteristic of the variable gain element of the circuit of FIG. 5.
Figure 6B:
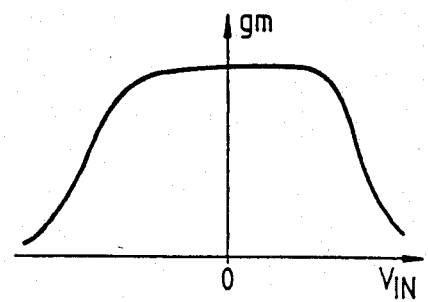

The transistors TR51,TR54 and TR53,TR52 of each pair are so designed that they have an emitter area mismatch in the ratio x:1. As can be seen from FIG. 6a this mismatch separates the signal/gain characteristics of the two pairs by a distance $V = 2(kt/q) \log x$ where k is Boltzmann's constant, t is the absolute temperature and q is the electronic charge. FIG. 6b shows the resultant gain characteristic of the two long tailed pairs. This characteristic has a substantially constant gain portion extending ½V on either side of the signal zero crossing. Beyond this constant gain region the characteristic falls smoothly away to zero. The stage is thus linear in operation for input signals below the soft clipping threshold.

The output of the variable gain stage is fed to an output stage which, typically, comprises an amplifier AMP 51 driving an output transistor TR55 the collector load of which, Z51, presents the required impedance to the line. Typically this impedance is 600 ohms, or 900 ohms in the USA.

A proportion of the output signal is fed to one input of a two input amplifier AMP 52 having first and second current outputs. The other input of amplifier AMP 52 is connected to a reference potential, e.g. the circuit ground. The outputs of the amplifier AMP 52, i.e. currents Ia and Ib are applied respectively to the tail circuits of the long tailed pairs TR51,TR54 and TR52,TR53. It should be noted that the sum of the two currents Ia and Ib remains substantially constant. Thus, whatever current is added (subtracted) at the tail circuit of one pair is subtracted (added) at the tail circuit of the other pair and the total current passed by the two pairs in combination remains constant. In this way the output impedance to the line of the whole circuit including the feedback loop is maintained at a substantially constant value.

The soft clip voltage threshold where the major gain regulation occurs is arranged substantially equal to the voltage level (positive or negative) where the peak of the gain (gm) characteristic (FIG. 6a) occurs and where the corresponding long tailed pair is in balance. When this occurs any feedback in the loop is "notched out" as shown by the negative feedback gain curves in FIG. 7. Hence, the current in the corresponding long-tailed pair can be reduced thus reducing the forward gain without causing a change in the output impedance.

Figure 7:
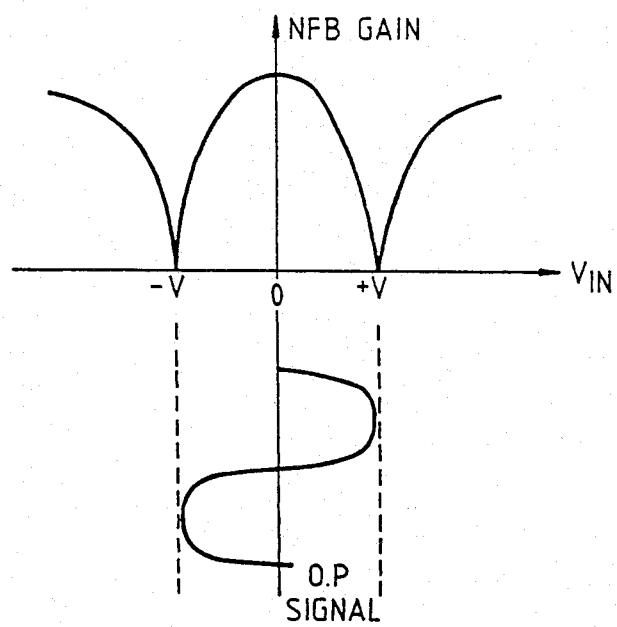
FIG. 7 illustrates the signal handling characteristic of the circuit of FIG. 5.

The design of the circuit is determined from the specification requirements of the end user, e.g. the telephone administration, wherein the output signal level for the onset of soft clipping is defined. From that signal level the emitter area ratios of the long tailed pair transistors can be defined. The feedback characteristic is also defined so that the feedback notch coincides with this soft clip level as indicated in FIG. 7. The circuit parameter calculations involved will be apparent to those skilled in the art.

Advantageously the arrangements described herein may comprise or form a part of an integrated circuit. In particular such arrangements may be used in a telephone subscriber's instrument to provide clipping of input speech without the generation of harmonics. The arrangement may also be employed as part of a circuit for a hearing aid, as a soft clipped waveform provides a high degree of audio perception together with a relatively low power input.

While I have described above the principles of my invention in connection with specific apparatus, it is to be clearly understood that this description is made only by way of example and not as a limitation to the scope of my invention as set forth in the objects thereof and in the accompanying claims.

I claim:

1. A speech processing circuit comprising a variable gain element to provide soft clipping of a speech signal coupled to its input and negative feedback means coupled between an output of said circuit and said variable gain element to control the gain of said element such that the circuit output impedance is maintained substantially independent of the amplitude of said speech signal.

2. A speech processing circuit comprising a continuously variable gain input stage, a signal amplifier coupled to the output of said input stage, an output stage coupled to the output of said amplifier, and rectifying feedback means coupled between said output stage and said input stage, said circuit being such that, at predetermined positive and negative output signal threshold levels within the saturation levels of said output stage, said feedback means generates a feedback signal to progressively reduce the gain of said input stage.

3. A speech processing circuit comprising first and second long tailed transistor pairs whereby speech signals coupled to an input of one said first and second pairs are soft clipped, an output amplifier stage coupled to said long tailed pairs, and negative feedback means coupled between said output stage and said long tailed pairs, wherein the transistors of said pairs are so constructed that gain maxima of said pairs are symmetrically disposed about the zero level of said speech signal and spaced from that level by a voltage corresponding to the onset of soft clipping, and wherein said feedback means is arranged to feed the tail circuits of said long tailed pairs with respective first and second currents whereby the combined output impedance of said long tailed pairs is maintained substantially constant.

4. A circuit as claimed in claim 3, wherein said negative feedback means includes a rectifying amplifier adapted to generate an output only for signals above a predetermined threshold level.

5. A circuit as claimed in claim 3, and including feedback means provided with a notch characteristic, the location of the notches of said characteristic corresponding to the soft clipping level of said circuit.

* * * * *